United States Patent [19]
Kawashima et al.

[11] 4,355,257
[45] Oct. 19, 1982

[54] THICKNESS SHEAR TYPE PIEZOELECTRIC VIBRATOR WITH INTEGRAL MOUNTING

[75] Inventors: Hirofumi Kawashima; Akira Watanabe; Yasunori Ebihara, all of Tokyo, Japan

[73] Assignee: Kabushiki Kaisha Daini Seikosha, Japan

[21] Appl. No.: 168,133

[22] Filed: Jul. 14, 1980

Related U.S. Application Data

[63] Continuation-in-part of Ser. No. 930,241, Aug. 2, 1978, abandoned, which is a continuation of Ser. No. 763,713, Jan. 28, 1977, abandoned.

[30] Foreign Application Priority Data

Feb. 29, 1976 [JP] Japan ..................................... 51/8636

[51] Int. Cl.³ ............................................ H01L 41/08
[52] U.S. Cl. .................................... 310/361; 310/367; 310/368; 310/320
[58] Field of Search ............... 310/320, 321, 360, 361, 310/367–369

[56] References Cited

U.S. PATENT DOCUMENTS 2,306,909 12/1942 Sykes ............................. 310/368 X
3,339,091 8/1967 Hammond et al. ................. 310/346
3,561,831 2/1971 Karrer et al. ..................... 310/346 X
4,012,648 3/1977 Engdahl ......................... 310/367 X
4,035,674 7/1977 Oguchi et al. ................... 310/367 X
4,071,796 1/1978 Zumsteg ......................... 310/361
4,124,809 11/1978 Engdahl et al. ................. 310/368 X

FOREIGN PATENT DOCUMENTS 351300 9/1972 U.S.S.R. .............................. 310/367

Primary Examiner—Mark O. Budd
Attorney, Agent, or Firm—Robert E. Burns; Emmanuel J. Lobato; Bruce L. Adams

[57] ABSTRACT

A thickness shear type piezoelectric vibrator comprises a quartz crystal plate of uniform thickness having a rectangular vibrating portion and integral rectangular supporting portions of less width extending from opposite ends of the vibrating portion. Electrodes of conducting material have elongated rectangular active portions on obverse and reverse surfaces of the vibrating portions of the plate. The electrode on the obverse surface of the plate has an integral lead portion extending along the obverse surface of only one of the supporting portions. The electrode on the reverse surface of the plate has an integral lead portion extending along the reverse surface of the other only of the supporting portions so that an electric field is applied by the electrodes only to the vibrating portion of the plate and not to the supporting portions.

10 Claims, 7 Drawing Figures $\theta = 30° \sim 45°$

THICKNESS SHEAR TYPE PIEZOELECTRIC VIBRATOR WITH INTEGRAL MOUNTING

REFERENCE TO PRIOR APPLICATION

This application is a continuation-in-part of our application Ser. No. 930,241 filed Aug. 2, 1978 (now abandoned) which was a Rule 60 Continuation of our application Ser. No. 763,713 filed Jan. 28, 1977 (now abandoned).

FIELD OF INVENTION

The present invention relates to a thickness shear type piezoelectric vibrator formed by etching means and having a vibrating portion and integral supporting portions.

BACKGROUND OF INVENTION

The conventional thickness shear type piezoelectric vibrator is formed by mechanical working and its shape is restricted to a disc type. However, the disc type vibrator is of such large dimensions that it is not suitable for use in wrist-watches.

Recently a rectangular type vibrator has been developed as an improvement of the disc type. However, in a small sized vibrator of this construction the energy loss in the supporting portion is very large and sufficient performance is not obtained. Moreover, by reason of insufficiencies in the supporting structure, a sub-vibration is frequently generated whereby the frequency-temperature characteristics of the vibrator are very bad.

SUMMARY OF THE INVENTION

It is an object of the present invention to eliminate the above-noted difficulties and insufficiencies and to provide a thickness shear type piezoelectric vibrator of small size having a simple supporting structure and good operating characteristics.

In accordance with the present invention a thickness shear type piezoelectric vibrator comprises a piezoelectric crystal plate having a vibrating portion and supporting portions of reduced width which are integral with the vibrating portion. Electrodes are disposed on opposite faces of the vibrating portion. In accordance with the invention, it is possible to produce vibrators of excellent operating characteristics by employing IC masking and etching techniques whereby it is possible to eliminate the occurrence of sub-vibration.

BRIEF DESCRIPTION OF DRAWINGS

The nature, objects and advantages of the invention will be more fully understood by the following description in conjunction with the accompanying drawings in which.

DESCRIPTION OF THE PRIOR ART

Figure 1:
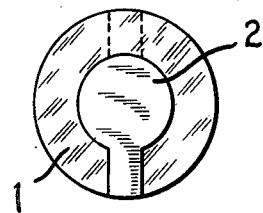
FIG. 1 is a plan view of a conventional disc type thickness shear type piezoelectric vibrator.

FIG. 1 shows a conventional disc-type thickness shear type piezoelectric vibrator comprising a disc shape quartz element 1 on opposite faces of which there are provided electrodes 2.

Figure 2:
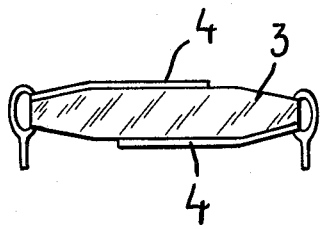
FIG. 2 is a side view of a conventional rectangular type thickness shear type piezoelectric vibrator.

FIG. 2 shows an improved rectangular type thickness shear type vibrator comprising a quartz element 3 on opposite sides of which there are provided electrodes 4. The vibrator is supported so as to generate a distortion in the normal supporting direction.

DESCRIPTION OF PREFERRED EMBODIMENT

Figure 3A:
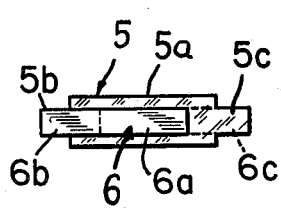
FIGS. 3A and 3B are respectively a plan view and a side view of a thickness shear type piezoelectric vibrator in accordance with the present invention.
Figure 3B:
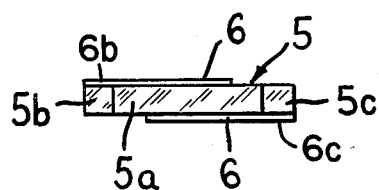

One embodiment of the present invention as shown by way of example in FIGS. 3A and 3B comprises a quartz crystal plate 5 of uniform thickness having electrodes 6 on opposite faces thereof. The quartz crystal element 5 comprises a vibrating portion 5a of rectangular shape and supporting portions 5b and 5c likewise of rectangular shape but of reduced width which project from opposite ends of the vibrating portion 5a. The supporting portions 5b and 5c have a width which is between one quarter and three quarters the width of the vibrating portion 5A. If the width of the supporting portions is less than one quarter the width of the vibrating portion, the element is fragile and difficult to produce with precision. If the supporting portions are wider than three quarters the width of the vibrating portion, significant energy loss will result. Preferably the width of the supporting portions 5b, 5c is approximately half the width of the vibrating portion 5a of the quartz plate. The rectangular shape of the supporting portions 5b, 5c whereby they are of uniform width—in contrast with being tapered—results in less energy loss and better operating characteristics.

The quartz element including the vibrating portion 5a and supporting portions 5b, 5c is formed integrally as one body. As the vibrating portion 5a and supporting portions 5b, 5c are of the same thickness, the quartz element can readily be formed from a quartz plate of uniform thickness by a cutting or etching operation. As the supporting portions 5b, 5c are thus integrally connected with the vibrating portion 5a of the quartz element, the vibrator is resistant to shock and other external conditions. The vibrator is supported by securing the end faces of the supporting portions 5b, 5c to a suitable supporting structure, for example by adhesive or solder.

Each of the electrodes 6 on opposite faces of the plate has an active portion 6a which is of less width and less length than the vibrating portion 5a of the plate. The electrode 6 on the obverse side of the plate as viewed in FIGS. 3a and 3b has a lead portion 6b which extends out along the obverse surface of the supporting portion 5b only of the plate. The electrode on the reverse side of the plate has a lead portion 6c which extends out along the reverse surface of the supporting portion 5c only of the plate. It will thus be seen that the electrodes apply an electric field only to the vibrating portion 5a of the plate and not at all to the supporting portions 5b and 5c. As shown by way of example FIGS. 3A and 3B, the lead portions 6b and 6c of the respective electrodes are of the same width as the active portions 6a.

In the conventional type thickness shear vibrator, a distortion is generated in the supporting direction whereby the loss of energy becomes larger. With the construction in accordance with the present invention, on the contrary, the energy loss in the supporting portions becomes smaller whereby loss of energy is maintained at a low level.

Figure 5:
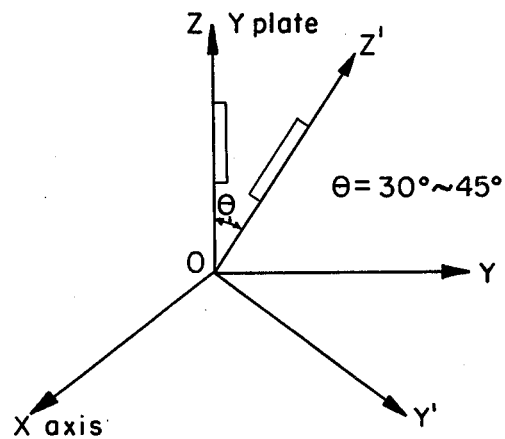
FIG. 5 is an explanatory view of the relation between the cutting angle and the crystal axis in accordance with the present invention.

In FIGS. 5A and 5B there is shown another embodiment of the invention comprising a quartz crystal plate 9 of uniform thickness which is of loop shape so as to provide a rectangular vibrating portion 9a, rectangular supporting portions 9b of reduced width projecting from opposite ends of the vibrating portion 9a and end portions 9c connecting the projecting ends of portions 9b with the ends of a bar portion 9d which lies alongside but spaced from the vibrating portion 9a. The vibrator is supported by securing the bar portion 9d to a suitable supporting structure, for example by solder or adhesive. Electrodes 10 are provided on opposite faces of the vibrating portion 9a of the quartz crystal plate 9.

It will be seen that the electrodes 10 have active portions 10a which are narrower and shorter than the vibrating portion 9a of the quartz crystal plate 9. The electrode 10 on the obverse side of the plate has a lead portion 10b which extends along the obverse face of the supporting portion 9b at the left end of the vibrating portion. The electrode on the reverse side of the plate has a lead portion 10b which extends along the reverse face of the supporting portion 9b at the right end of the vibrating portion 9a. Thus the electrode apply an electric field only to the vibrating portion 9a of the plate. The lead portions 10b of the electrodes are narrower than the active portions 10a and narrower than the supporting portions 9b of the plate. The lead portions 10b of the electrodes extend only along the supporting portions 9b of the plate. The bar portion 9d and connecting portions 9c are completely free of electrode material.

As in the embodiment illustrated in FIGS. 3A and 3B, the vibrating portion 9a and supporting portions 9b of the plate are of the same thickness as are also the bar portion 9d and connecting portions 9c. Thus the vibrator can readily and economically be formed from a quartz plate of uniform thickness by cutting or etching.

By reason of the vibrating portion 9a of the quartz crystal plate being spaced from the bar portion 9d and the supporting portions 9b being of reduced width, the loss of energy in the vibrating portion is very small while at the same time the vibrating portion is rigidly supported by the supporting portions 9b. As in the embodiment illustrated in FIGS. 3A and 3B, the supporting portions 9b of the plate have a width which is between one quarter and three quarters the width of the vibrating portion 9a of the plate and preferably about half the width of the vibrating portion.

Figure 4A:
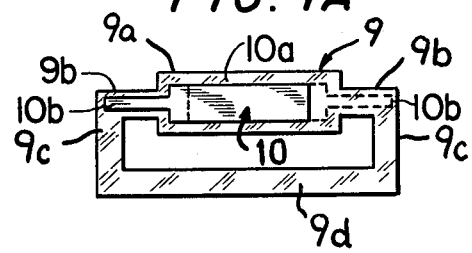
FIGS. 4A and 4B are respectively a plan view and a side view of another embodiment of the invention.
Figure 4B:
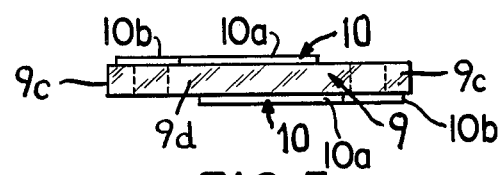

It will thus be seen that in accordance with the present invention it is possible to obtain a quartz fibrator having a supporting structure which is integral with the vibrating portion of the quartz plate but which avoids large energy loss. The quartz elements in accordance with the present invention are conveniently formed from a quartz crystal plate by masking and etching techniques. It is thereby possible to obtain the desired shape economically including the shapes shown by way of example in FIGS. 3A and 4A.

The quartz crystal plate of which the quartz elements are formed is cut from a quartz crystal having an X-axis (electrical axis), Y-axis (mechanical axis) and Z-axis (optic axis). As illustrated in FIG. 6, the cutting angle of the quartz element in accordance with the present invention is such that the Y-plate is rotated through an angle of 30° to 45° about the X-axis.

While preferred embodimnts of the invention have been illustrated in the drawings and are herein particularly described, it will be understood that many variations and modifications are possible and hence the invention is no way limited to the illustrated embodiments.

What is claimed is:

1. A thickness shear type quartz crystal vibrator comprising a thin quartz plate of uniform thickness cut from the Y-plate rotated through an angle of 30° to 40° about the X-axis and shaped by etching to form a rectangular vibrating portion elongated along the X-axis and of uniform thickness throughout its width and length, and integral rectangular supporting portions extending respectively from opposite ends of said rectangular vibrating portion and of uniform width throughout their length, said vibrating portion and integral supporting portions being of the same uniform thickness, and the width of said supporting portions of said quartz plate being between one quarter and three quarters the width of said vibrating portion, and electrodes of conducting material having elongated rectangular active portions on the obverse and reverse surfaces of the vibrating portion of said plate respectively, the electrode on the obverse surface of said plate having an integral lead portion extending along the obverse surface of one only of said supporting portions and the electrode on the reverse surface of said plate having an integral lead portion extending along the reverse surface of the other body of said supporting portions, whereby an electric field is applied by said electrodes only to said vibrating portion of said plate and is not applied at all to said supporting portions.

2. A thickness shear type piezoelectric vibrator according to claim 1, in which said active portions of said electrodes have a width less than the width of said vibrating portion of said plate.

3. A thickness shear type piezoelectric vibrator according to claim 2, in which said active portions of said electrodes have a length less than the length of said vibrating portion of said plate.

4. A thickness shear type piezoelectric vibrator according to claim 3, in which said lead portions of said electrodes have a width equal to the width of said active portions of said electrodes.

5. A thickness shear type piezoelectric vibrator according to claim 3, in which said lead portions of said electrode have a width less than the width of said active portions of said electrodes.

6. A thickness shear type piezoelectric vibrator according to claim 1, in which said plate has the shape of a rectangular loop in which said vibrating portion and said supporting portions together comprise one side of said loop, an elongate bar portion comprises a parallel opposite side of said loop and opposite end portions integrally connecting opposite ends of said bar portion with said supporting portions respectively comprise end portions of said loop, said lead portions of said electrodes extending only along said supporting portions respectively whereby said bar portion and end portions are free of electrode material.

7. A thickness shear type piezoelectric vibrator according to claim 6, in which said active portions of said electrodes have a width less than the width of said vibrating portions of said plate.

8. A thickness shear type piezoelectric vibrator according to claim 7, in which said active portions of said electrodes have a length less than the length of said vibrating portions of said plate.

9. A thickness shear type piezoelectric vibrator according to claim 8, in which said lead portions of said electrode having a width less than the width of said active portions.

10. A thickness shear type piezoelectric vibrator according to claim 1 or 6, in which the width of said supporting portions of said quartz plate is approximately half the width of said vibrating portion.

* * * * *